US005893795A

United States Patent [19]
Perlov et al.

[11] Patent Number: 5,893,795
[45] Date of Patent: Apr. 13, 1999

[54] APPARATUS FOR MOVING A CASSETTE

[75] Inventors: Ilya Perlov; Eugene Gantvarg, both of Santa Clara, Calif.

[73] Assignee: Applied Materials, Inc., Santa Clara, Calif.

[21] Appl. No.: 08/890,782

[22] Filed: Jul. 11, 1997

[51] Int. Cl.⁶ ............................................. B24B 29/00
[52] U.S. Cl. .......................... 451/288; 414/940; 312/273
[58] Field of Search ........................... 451/288, 287, 451/41, 5, 334; 414/940, 939; 312/273, 274

[56] References Cited

U.S. PATENT DOCUMENTS

| 4,717,461 | 1/1988 | Strahl et al. | 204/192 |
| 4,718,975 | 1/1988 | Bowling et al. | 156/643 |
| 4,944,119 | 7/1990 | Gill, Jr. et al. | 51/215 |
| 4,951,601 | 8/1990 | Maydan et al. | 118/719 |
| 5,095,661 | 3/1992 | Gill, Jr. et al. | 51/131.3 |
| 5,498,199 | 3/1996 | Karlsrud et al. | 451/289 |
| 5,566,076 | 10/1996 | Kuroda | 364/478 |
| 5,628,828 | 5/1997 | Kawamura et al. | 118/719 |
| 5,636,964 | 6/1997 | Somekh et al. | 414/786 |
| 5,655,869 | 8/1997 | Scheler et al. | 414/222 |
| 5,664,925 | 9/1997 | Muka et al. | 414/217 |
| 5,709,519 | 1/1998 | Uehara et al. | 414/416 |

*Primary Examiner*—David A. Scherbel
*Assistant Examiner*—Philip J. Hoffmann
*Attorney, Agent, or Firm*—Fish & Richardson

[57] ABSTRACT

A loading apparatus includes a cassette loader with a cassette support plate that can extend through a window of an enclosure. A cassette on the support plate can be moved through the window. A motor rotates the support plate to place the cassette in position to be lifted by a robotic arm and transferred to a holding tub. When the support plate is rotated, a shield moves to a position to close the window.

10 Claims, 12 Drawing Sheets

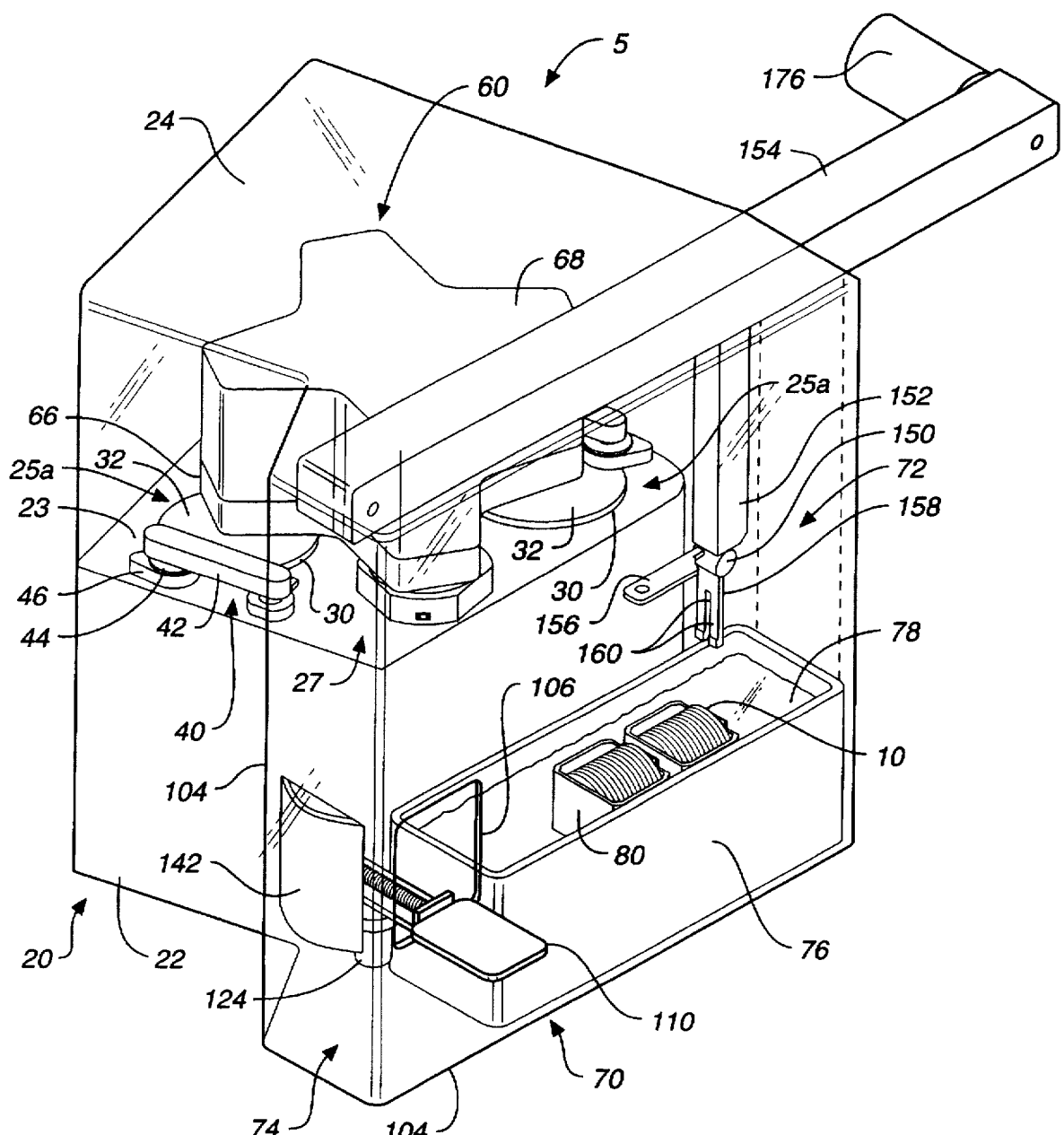
FIG._1

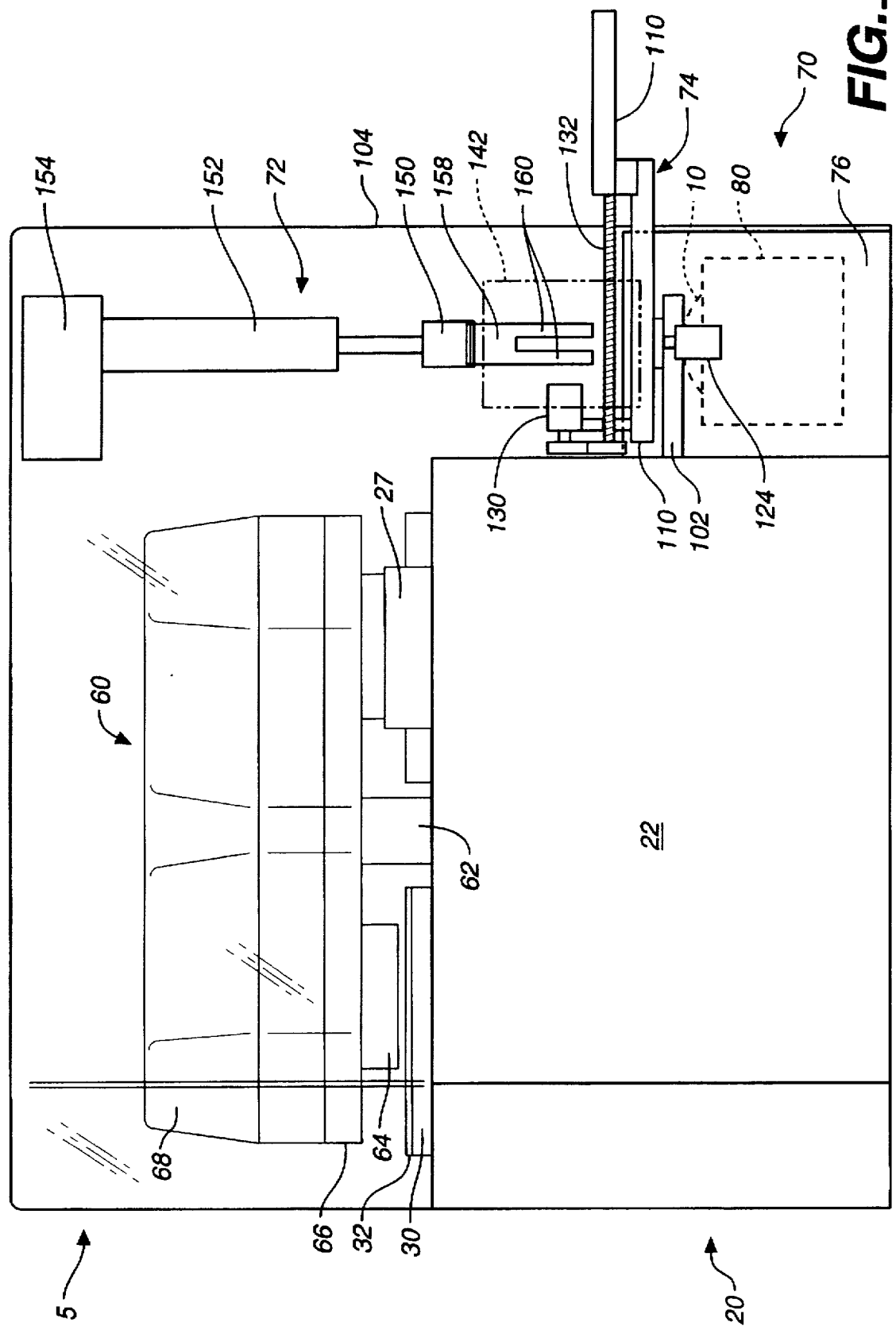

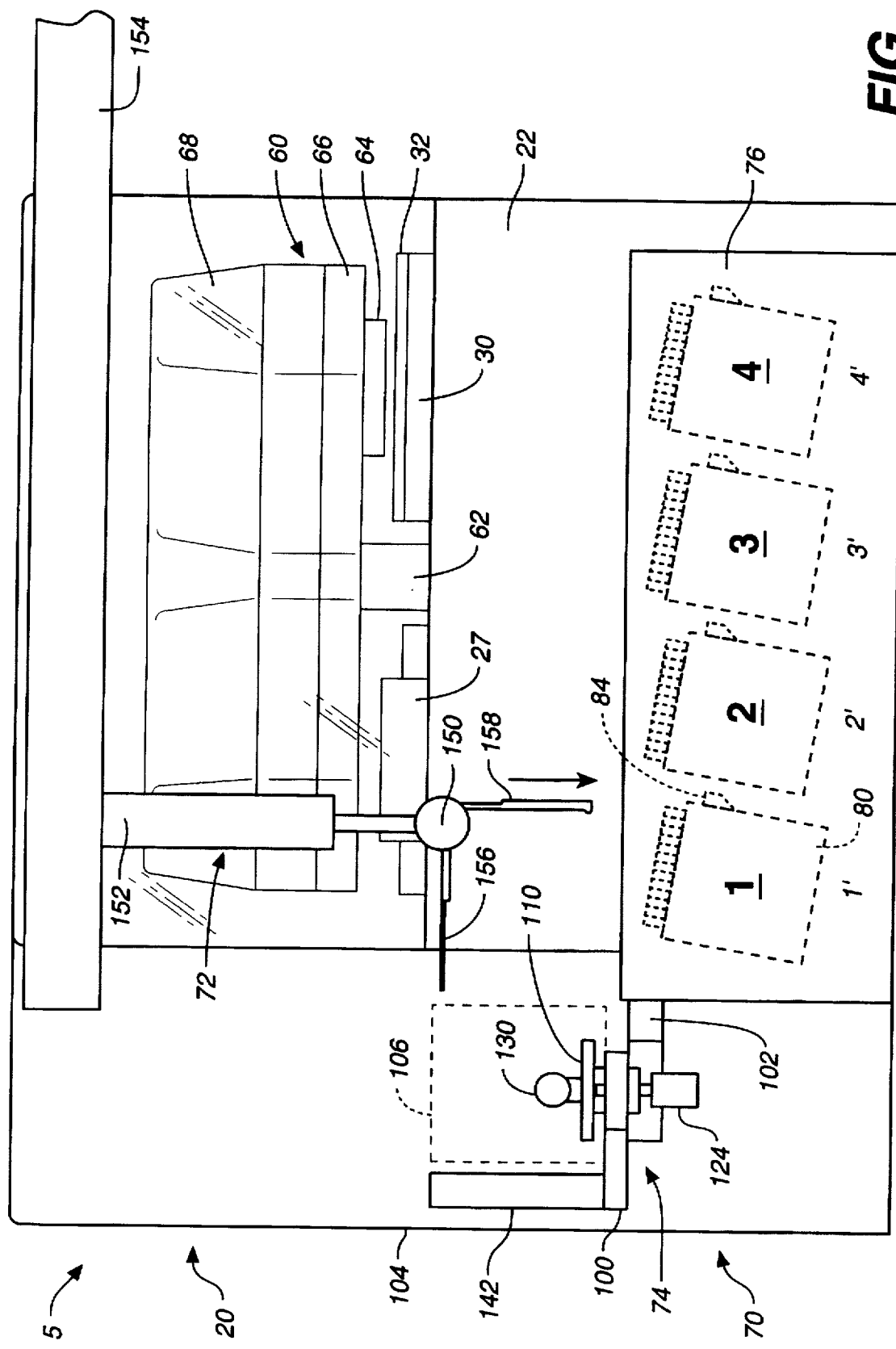
FIG._3

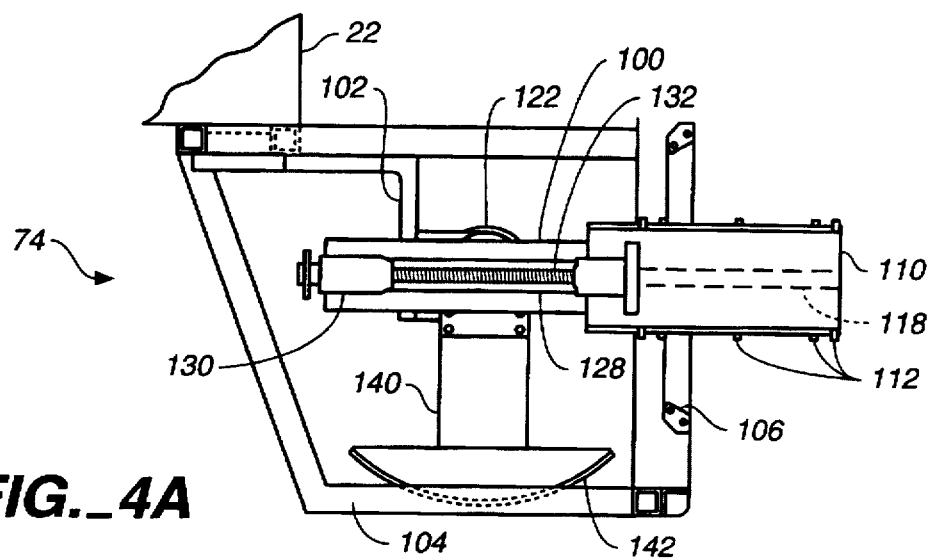
FIG._4A
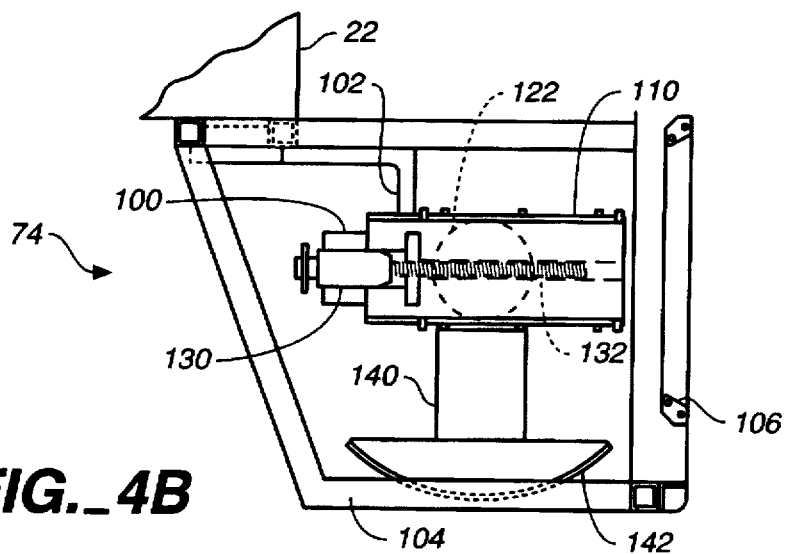
FIG._4B
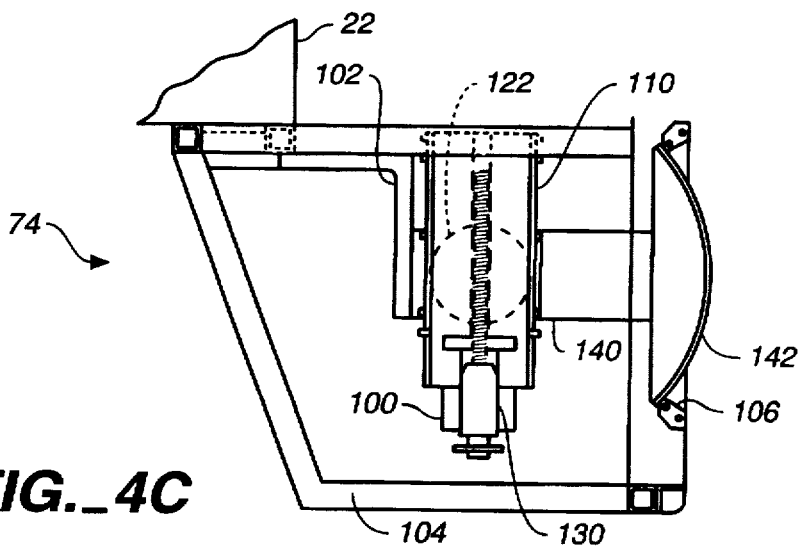
FIG._4C

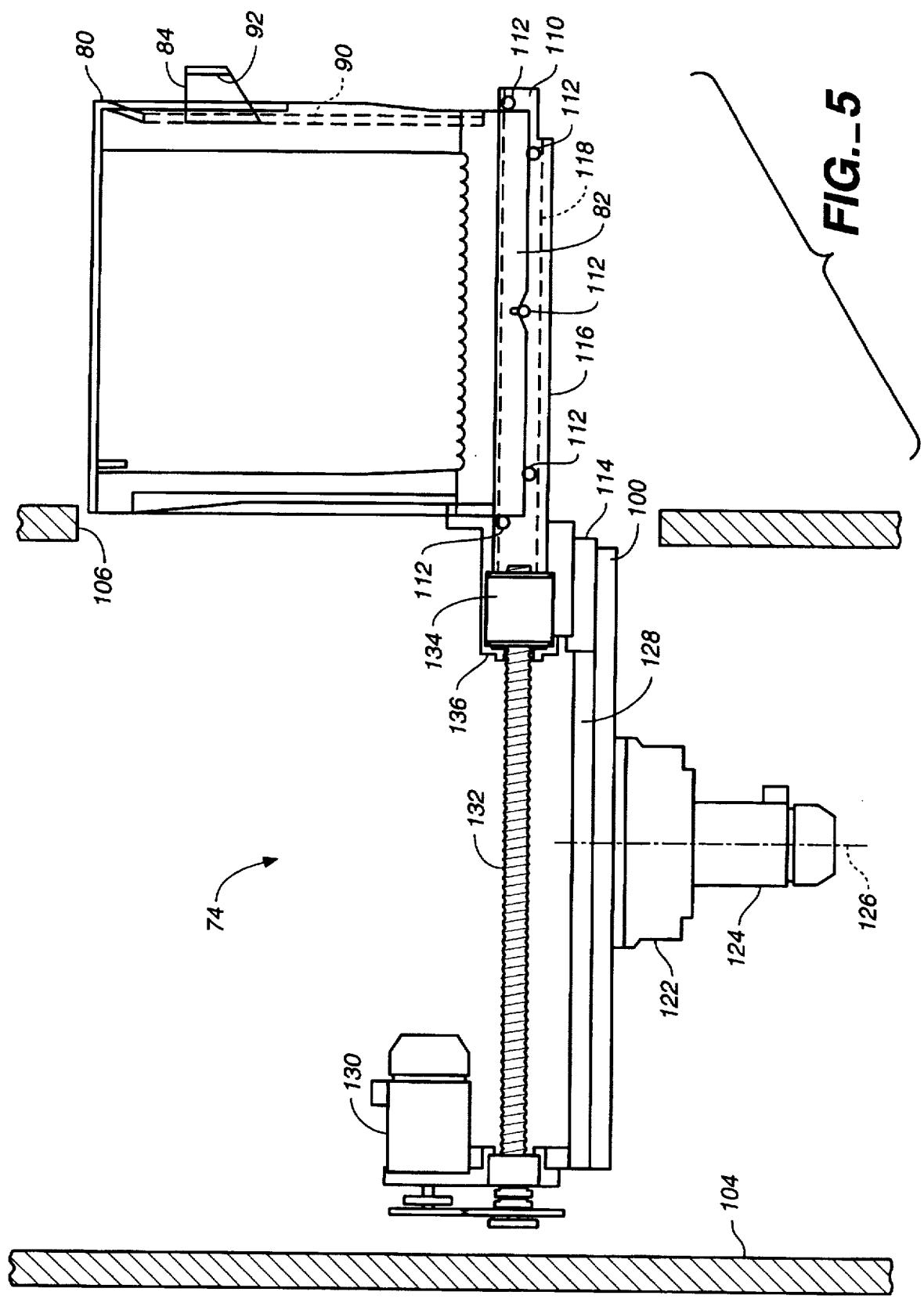

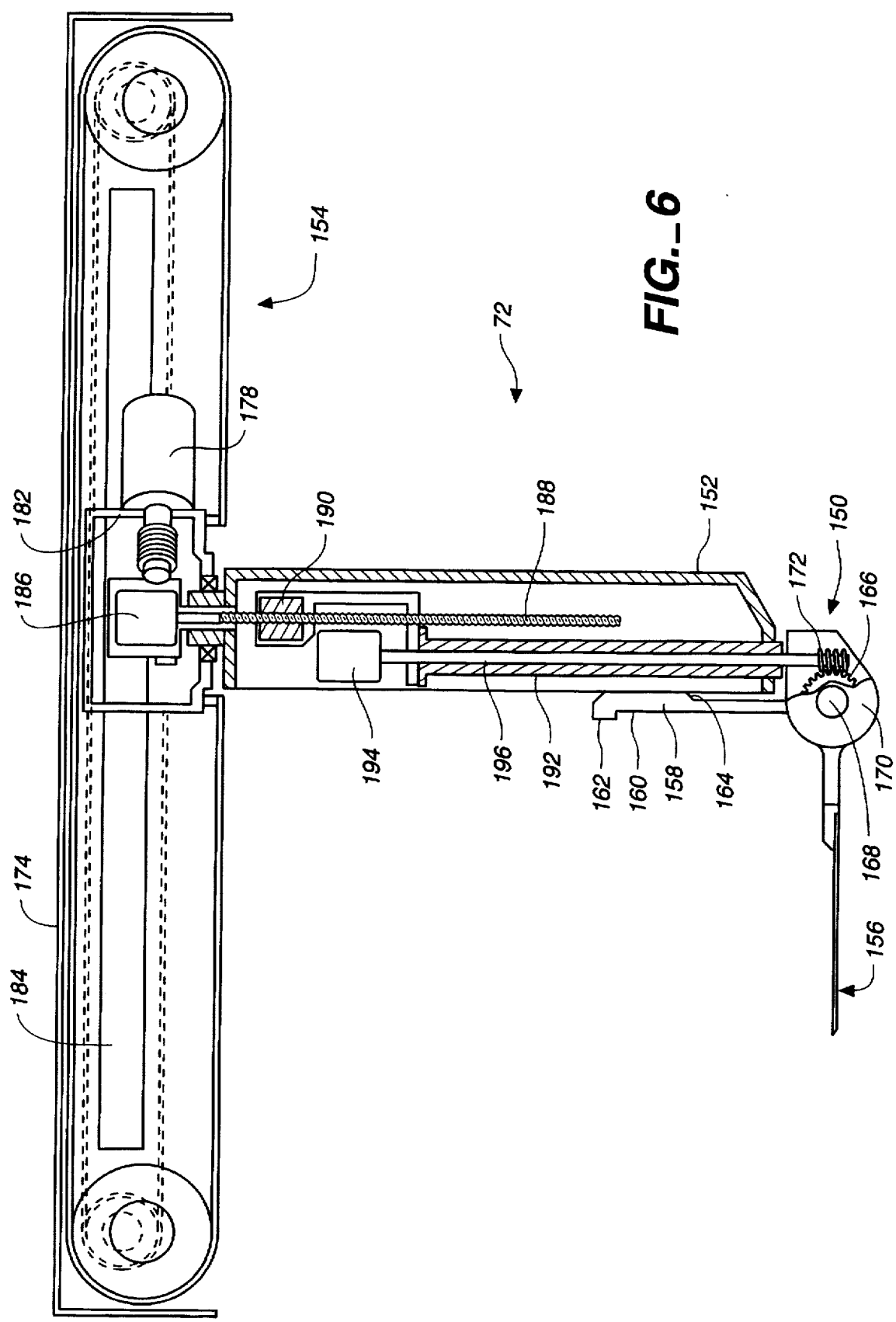

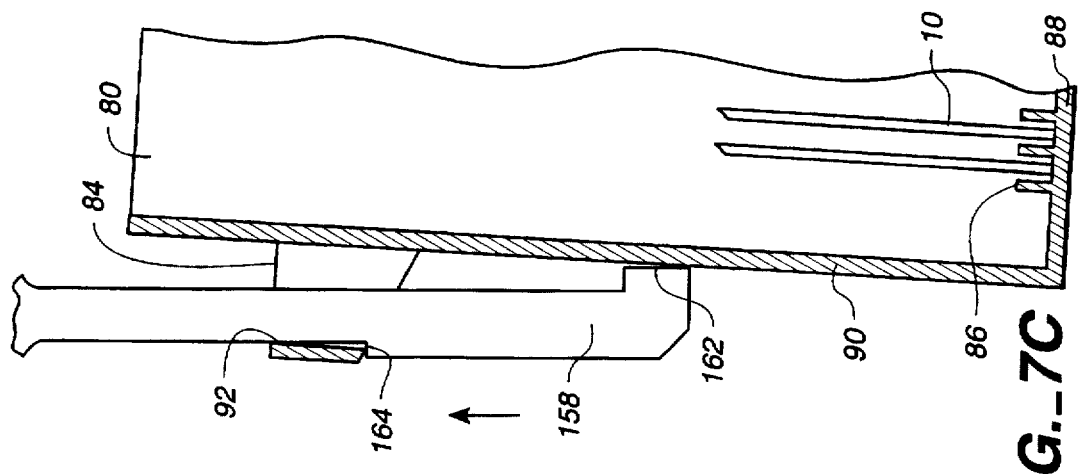
FIG._7A
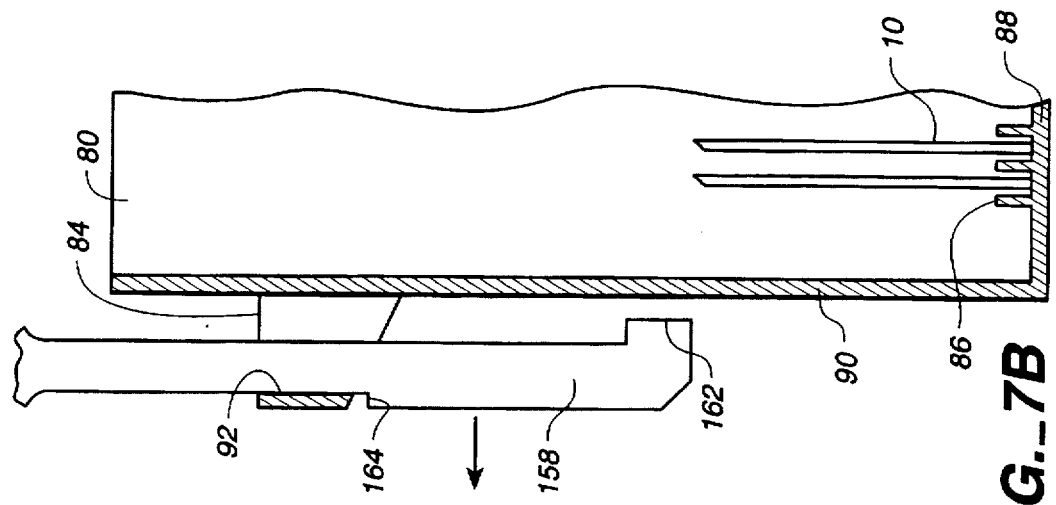
FIG._7B
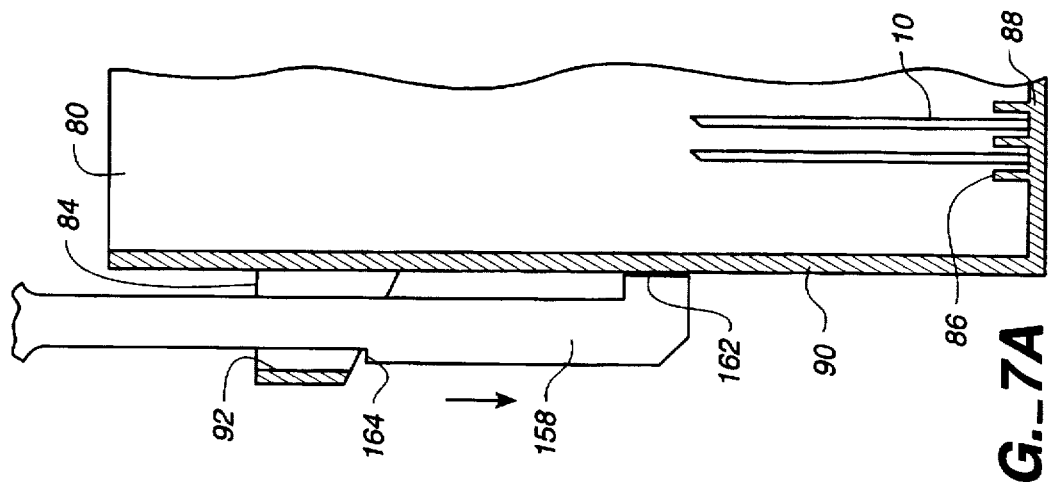
FIG._7C

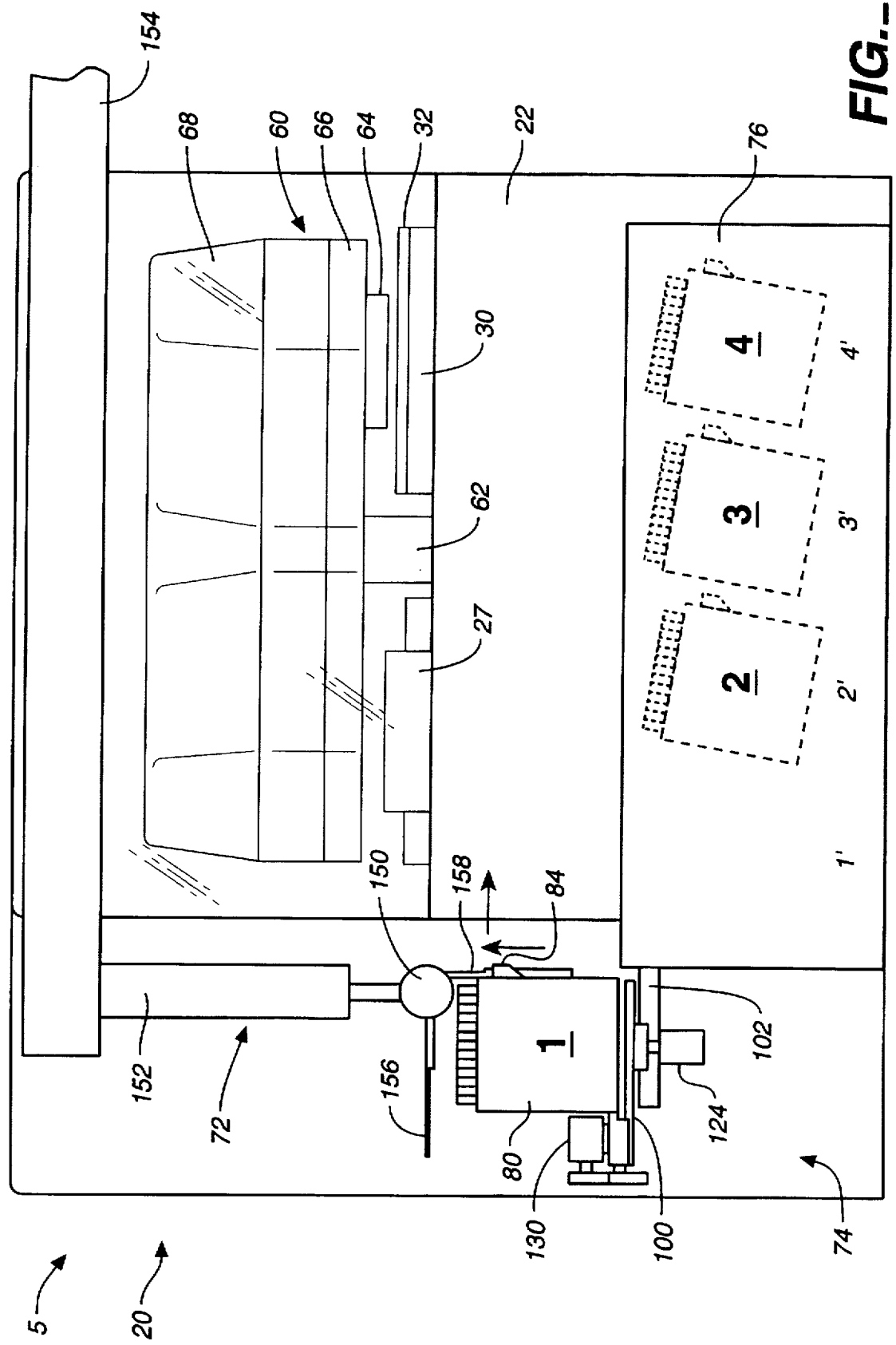

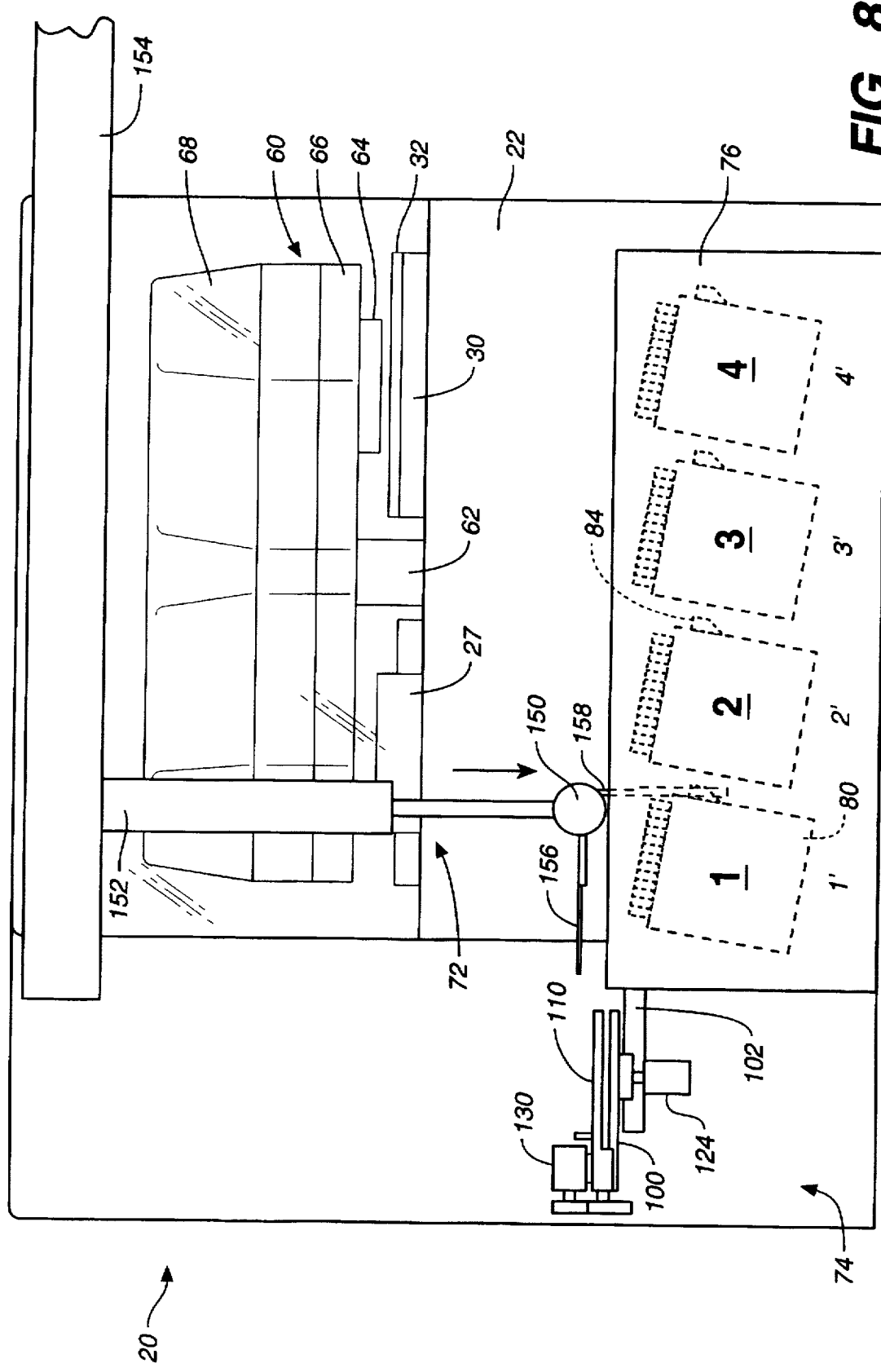
FIG._8B

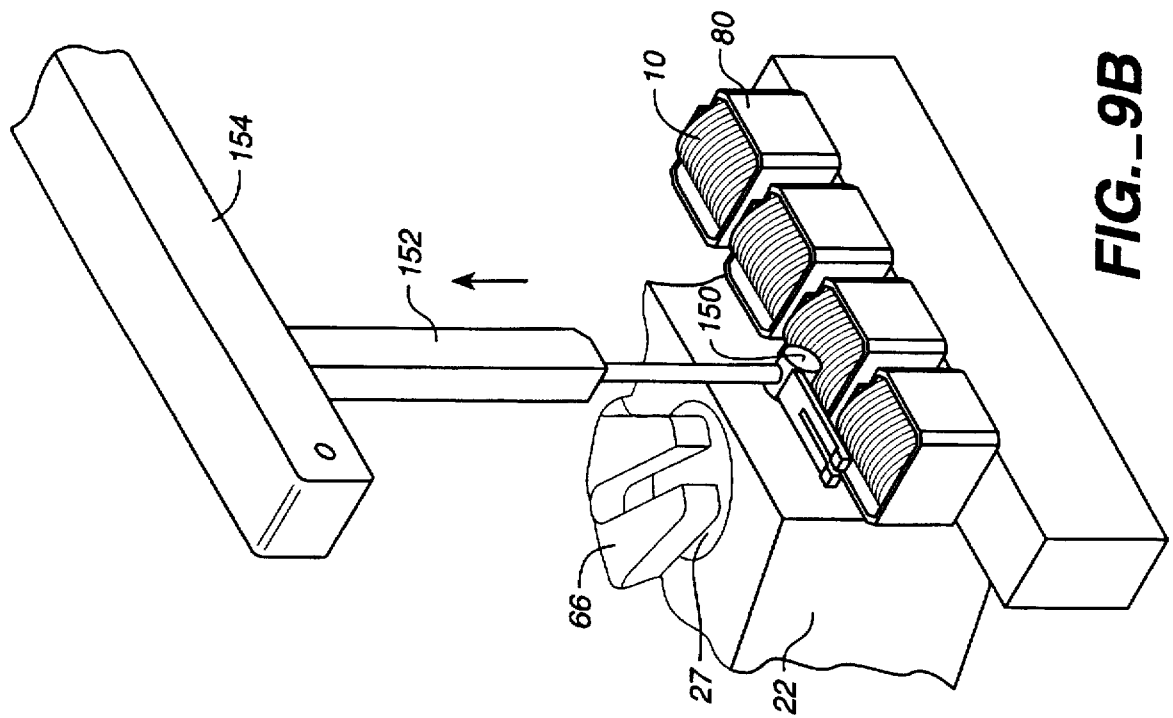
FIG._9B
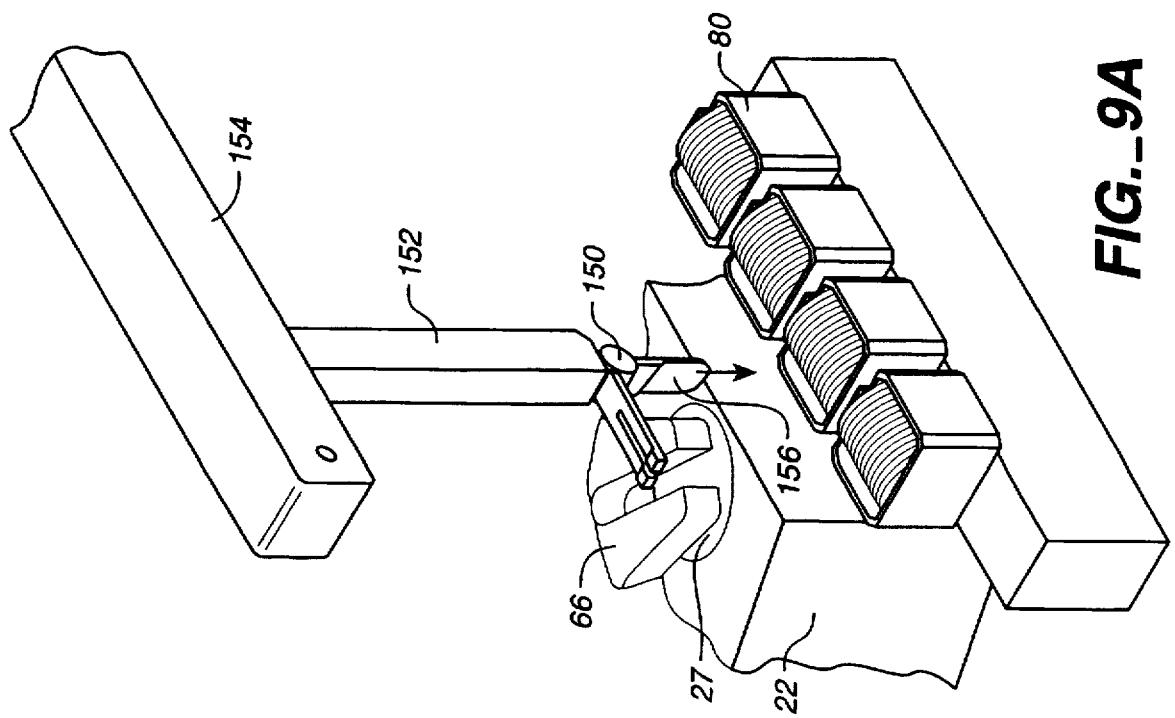
FIG._9A

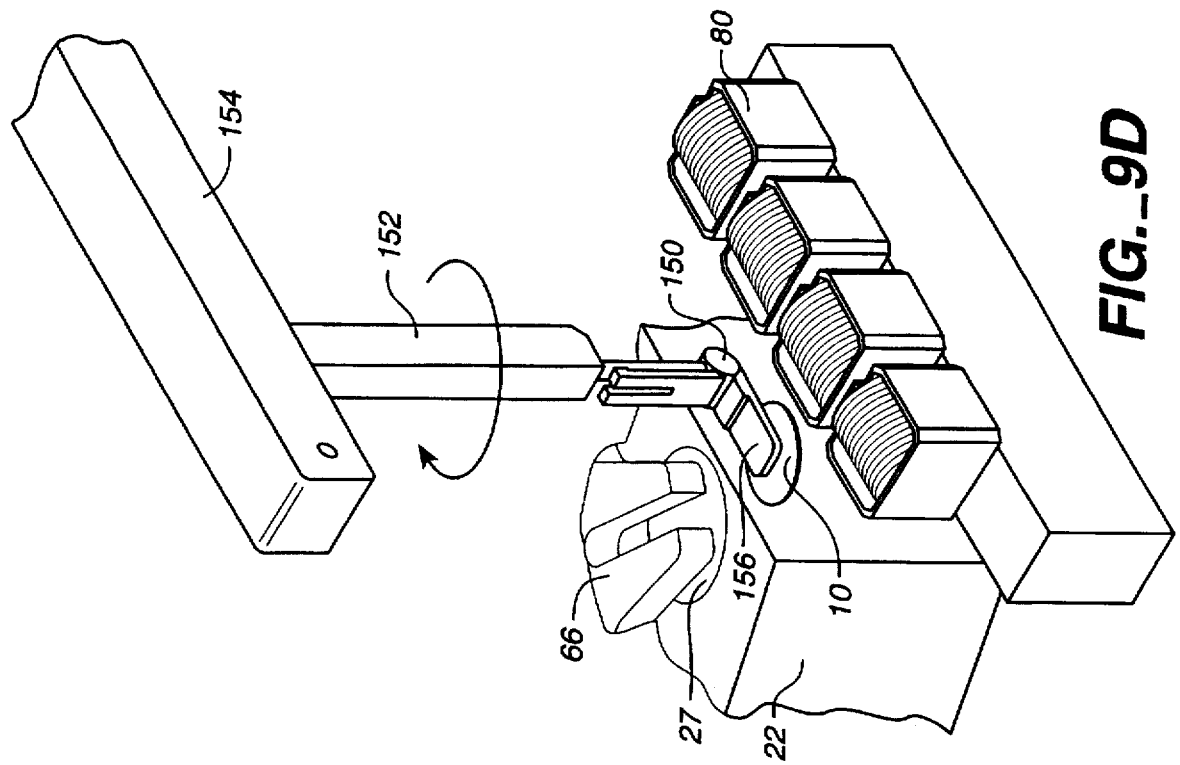
FIG._9D
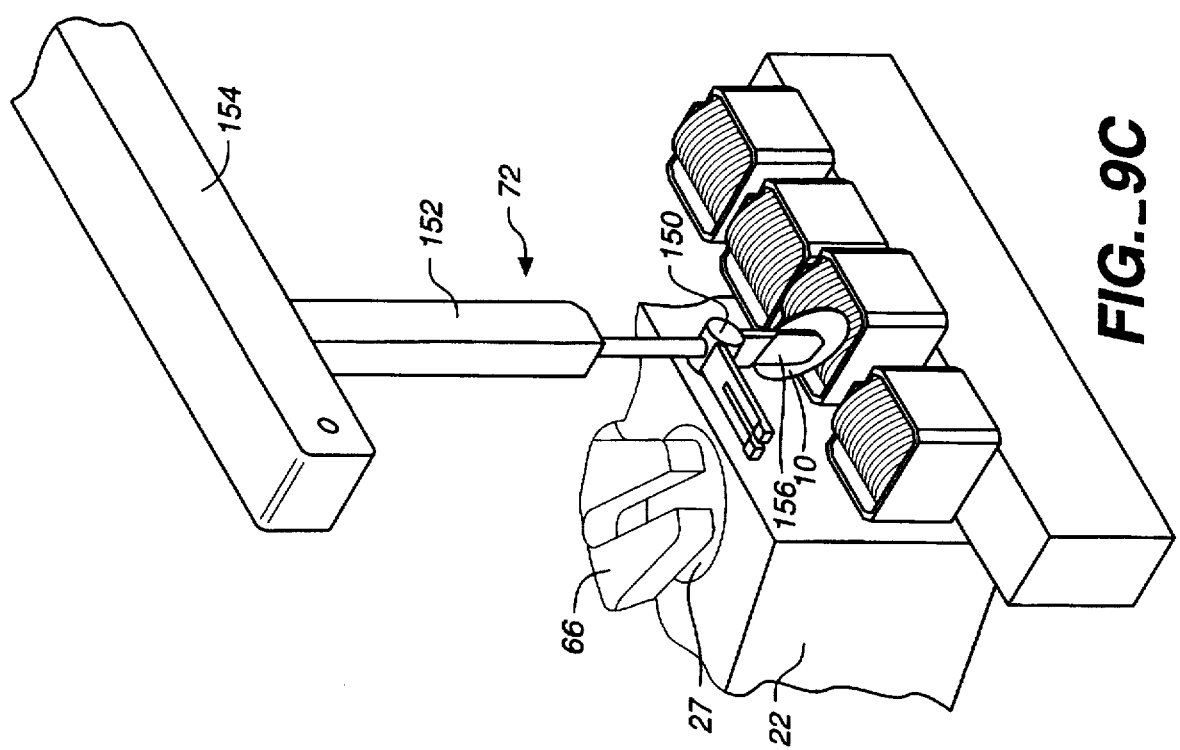
FIG._9C

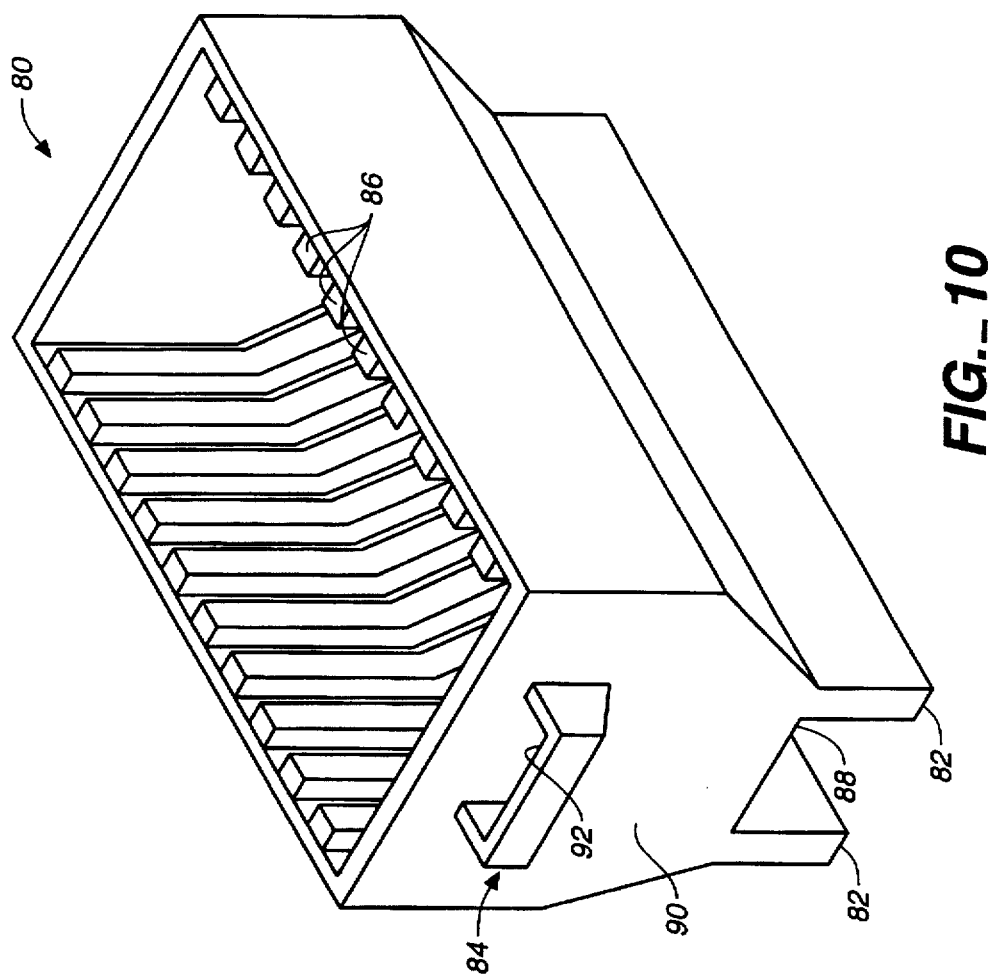
FIG._10
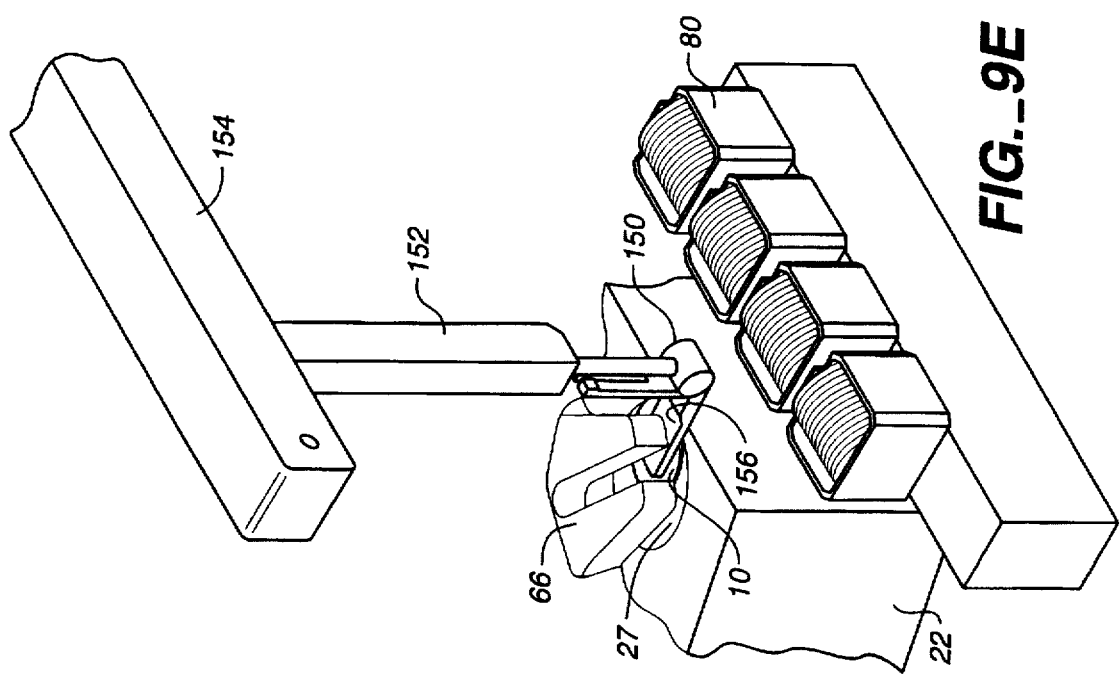
FIG._9E 5,893,795

1

APPARATUS FOR MOVING A CASSETTE

BACKGROUND OF THE INVENTION

The present invention relates generally to chemical mechanical polishing of substrates, and more particularly to an apparatus for moving a cassette in a polishing station.

Chemical mechanical polishing (CMP) is one method of planarizing substrates. This planarization method typically requires that the substrate be mounted on a carrier or polishing head in a CMP apparatus. The exposed surface of the substrate is placed against a rotating polishing pad and a polishing slurry is supplied to the polishing pad. The interaction of the polishing pad, slurry and substrate results in polishing.

Substrates are typically transported in cassettes between different stations in an integrated circuit fabrication process. As such, the substrates may be exposed to contaminants when they are moved, for example, to and from the polishing station. For instance, the substrates may be exposed to contaminants when lowered into a holding tub which stores the cassettes before polishing.

Thus, there is a need to quickly move cassettes into and out of a polishing station with minimal risk of contaminating the substrates.

SUMMARY OF THE INVENTION

In one aspect, the invention is directed to an apparatus for transporting a substrate-holding cassette to a chemical mechanical polisher. The apparatus comprises an enclosure having a loading port, a support member, a cassette support, a first motor, a shield, and a second motor. The support member is pivotable about a vertical axis and positioned inside the enclosure, and the cassette support is slidably connected to the support member and movable along a horizontal axis. The first motor linearly positions the cassette support along the horizontal axis. The shield is connected to the support member at a position offset from the horizontal axis. The second motor rotates the support member between a first position in which the shield is aligned with the loading port and a second position in which the horizontal axis is aligned with the loading port so that the cassette support may be driven by the first motor to extend through the loading port.

Implementations of the invention may include the following. The shield may be a transparent window. The first motor may rotate a lead screw to move the cassette support along the horizontal axis. The support member may include a linear rail and the cassette support may include a hand to engage the rail. A robotic arm, which may include a rotatable claw, may move the cassette between a holding tank and the cassette support when the support member is in the first position.

In another aspect, the invention is directed to a chemical mechanical polishing station. The station comprises an enclosure having a loading port, a support member positioned inside the enclosure, a cassette support slidably connected to the support member, a first motor to linearly position the cassette support, a shield connected to the support member, and a second motor to rotate the support member between a first position in which the shield is aligned with the loading port and a second position in which the cassette support may be driven by the first motor to extend through the loading port. The station also comprises a holding tank, a chemical mechanical polisher including a rotatable polishing pad and a carrier head to hold a substrate in contact with the polishing pad, and a robotic arm. The robotic arm moves the cassette between the holding tank and the cassette support when the support member is in the first position, and moves the substrate between a cassette in the holding tank and the polishing apparatus.

In another aspect, the invention is directed to a method of transporting a substrate-holding cassette to a chemical mechanical polisher. A support member is pivoted about a vertical axis to a first position, and a cassette support which is slidably connected to the support member is extended through a loading port in an enclosure. A cassette is placed on the cassette support, and the cassette support is withdrawn through the loading port. The support member is pivoted to a second position in which a shield that is connected to the support member is aligned with the loading port.

Advantages of the invention may include one or more of the following. Cassettes containing substrates are quickly and efficiently moved into a holding tub at a CMP station with a reduced risk of contamination. This CMP station may be is integrated with other stations in an integrated circuit fabrication process.

Other features and advantages of the invention will be apparent from the description which follows, including the drawings and claims.

BRIEF DESCRIPTION OF THE DRAWINGS

FIG. 1 is a schematic perspective view of a CMP station according to the present invention.

FIG. 2 is a schematic front view of the polishing station of FIG. 1.

FIG. 3 is a schematic side view of the polishing station of FIG. 1.

FIGS. 4A–4C are schematic top views of a cassette loader according to the present invention.

FIG. 5 is a cross-sectional view along line 5—5 in FIG. 4A showing the cassette loader supporting a cassette.

FIG. 6 is a cross-sectional view of a robot arm from the loading apparatus.

FIGS. 7A–7C are schematic side views illustrating how a loading claw engages a cassette.

FIGS. 8A–8B are schematic side views illustrating the loading apparatus moving a cassette from the cassette loader to a holding tub.

FIGS. 9A–9E are schematic perspective views illustrating the loading apparatus moving a substrate from the holding tub to the transfer station.

FIG. 10 is a schematic perspective view of a cassette for holding substrates.

DETAILED DESCRIPTION OF THE INVENTION

Referring to FIGS. 1–3, a CMP station 5 includes a CMP apparatus 20 and a loading apparatus 70. A description of a similar polishing station may be found in U.S. patent application Ser. No. 08/549,336, entitled RADIALLY OSCILLATING CAROUSEL PROCESSING SYSTEM FOR CHEMICAL MECHANICAL POLISHING, filed Oct. 27, 1995, by Ilya Perlov, et al., assigned to the assignee of the present invention, the entire disclosure of which is incorporated herein by reference.

The CMP apparatus 20 includes a lower machine base 22 with a table top 23 mounted thereon and a removable outer cover 24. Table top 23 supports a series of polishing stations 25a, 25b and 25c, (only two are shown in the perspective view of FIG. 1) and a transfer station 27. Transfer station 27 forms a generally square arrangement with the three polishing stations 25a, 25b and 25c. Transfer station 27 serves multiple functions, including receiving individual substrates 10 from loading apparatus 70, washing the substrates, loading the substrates into carrier heads, receiving the substrates from the carrier heads, washing the substrates again, and finally, transferring the substrates back to the loading apparatus.

Each polishing station 25a–25c includes a rotatable platen or platen assembly 30 on which is placed a polishing pad 32. If substrate 10 is an eight inch (200 millimeter) diameter disk, then platen 30 and polishing pad 32 will be about twenty inches in diameter. For most polishing processes, a platen drive motor (not shown) located in machine base 22 rotates platen 30 at thirty to two hundred revolutions per minute, although lower or higher rotational speeds may be used.

Each polishing station 25a–25c also may include an associated pad conditioner apparatus 40. Each pad conditioner apparatus 40 has a rotatable arm 42 holding an independently rotating conditioner head 44 and an associated washing basin 46. The conditioner apparatus maintains the condition of the polishing pad so it will effectively polish any substrate pressed against it while it is rotating.

A slurry containing a reactive agent (e.g., deionized water for oxide polishing) and a chemically-reactive catalyzer (e.g., potassium hydroxide for oxide polishing) is supplied to the surface of polishing pad 32 by a slurry supply port or a slurry supply arm (not shown). If polishing pad 32 is a standard pad, the slurry may also include abrasive particles (e.g., colloidal silicon oxide). Sufficient slurry is provided to cover and wet the entire polishing pad 32.

Referring to FIG. 2, a rotatable multi-head carousel 60 is positioned above lower machine base 22. Carousel 60 is supported by a center post 62 and is rotated thereon by a carousel motor assembly located within machine base 22. The center post 62 supports a carousel support plate 66 and a cover 68. The carousel 60 supports four polishing or carrier heads 64. Three of the carrier heads receive and hold substrates, and polish them by pressing them against the polishing pads on the platen assemblies of polishing stations 25a–25c. One of the carrier heads receives a substrate from and delivers a substrate to transfer station 27. Each carrier head independently rotates about its own axis, and independently laterally oscillates in a radial slot formed in carousel support plate 66. The carousel motor assembly may rotate the carousel to move the carrier heads between the polishing stations and the transfer station.

Referring to FIG. 10, One or more substrates 10 are brought to the polishing station in a cassette 80. Substrates 10 are supported in cassette 80 in a generally upright and parallel configuration by slot ridges 86. Each cassette 80 includes two linear support legs 82 projecting from a bottom surface 88 of the cassette. In addition, each cassette 80 has a handle 84 which projects from a sidewall 90.

Returning to FIGS. 1–3, loading apparatus 70 includes a cassette loader 74 for loading and unloading of cassette 80, and a robot arm 72 to move the cassettes between the cassette loader and a holding tub 76. Robot arm 72 may also move substrates 10 between cassette 80 in holding tub 76 and, for example, CMP apparatus 20. Cassette loader 74 and robot arm 72 will be described in greater detail below. Holding tub 76 is filled with a liquid bath 78. As shown in FIG. 3, four cassettes 1–4 may be placed at four cassette holding locations 1'–4', although the holding tub could have room for a different number of cassettes. In operation, cassettes 80 are stored in holding tub 76 to keep the substrates therein wet. The substrates 10 are individually loaded from cassette 80 into transfer station 27 of CMP apparatus 20 for polishing and then returned to the original cassette or another one in the holding tub.

A wall (not shown) may be interposed between CMP apparatus 20 and loading apparatus 70 so as to contain the slurry and other polishing debris within the CMP apparatus. A sliding door (not shown) in the wall is opened for transfer of substrates between the CMP apparatus and the loading apparatus.

Referring to FIG. 3, as briefly described above, cassette loader 74 transfers cassette 80 into and out of CMP station 5. A cassette may be transferred to cassette loader 74 from other fabrication stations by a robotic apparatus or by a human operator. Once the cassette is placed in the cassette loader, robot arm 72 moves the cassette to the holding tub. Once the substrates in the cassette have been polished, the robot arm may return the cassette to the cassette loader. Then the robotic apparatus or an operator may retrieve the cassette from the cassette loader and transport it to the next fabrication station.

Referring to FIGS. 4A and 5, cassette loader 74 may be surrounded by an outer cover 104, which may be secured to machine base 22. The cassette may be moved into and out of the CMP station through a loading port 106 in outer cover 104. The outer cover may be transparent. For the purpose of clarity, cassette 80 is not shown in FIGS. 4A–4C.

Cassette loader 74 includes a pivotable or rotatable support member 100 connected to machine base 22 by an arm 102. Support member 100 may be pivotally connected to arm 102 by a bearing assembly 122, and a rotary drive motor 124 may rotate support member 100 about a vertical axis 126. A rail 128 may extend lengthwise along a top surface of support member 100.

Cassette loader 74 also includes a cassette support plate 110 slidably attached to support member 100. A plurality of pins 112 may project from the sides of the support plate. Cassette support plate 110 also includes a hand 114 which extends from a bottom surface 116 of the support plate to engage rail 128.

Support member 100 may be coupled to a linear drive motor 130 located at one end of rail 128. Linear drive motor 130 drives a worm-gear lead screw 132 which fits into a threaded receiving nut 134 attached to cassette support plate 110. Receiving nut 134 may be secured to cassette support plate 110 by a clamp 136. In the retracted position, as shown in FIG. 4B, lead screw 132 may fit into a lead screw receiving cavity 118 in cassette support plate 110. Lead screw 132 is aligned with rail 128 so that when linear drive motor 130 rotates lead screw 132, cassette support plate 110 moves linearly along rail 128. In addition, the entire assembly, including support member 100, cassette support plate 110 and linear drive motor 130, may be pivoted about vertical axis 126 by rotary drive motor 124.

A window support flange 140 may be connected to support member 100. The window support flange 140 may extend at a right angle to cassette support plate 110. A window or shield 142 for closing loading port 106 may be connected to a distal end of the window support flange. Window 142 may be an arcuate segment formed of a transparent material. Window 142 and window support flange 140 are not shown in the view of FIG. 5 for clarity.

Referring to FIGS. 1, 2 and 4A, cassette support plate 110 may extend through loading port 106. To load a cassette into the CMP station, a cassette 80 is placed onto cassette support plate 110. Cassette 80 rests on cassette support plate 110 so that its legs 82 straddle the support plate and are supported by pins 112 (see FIG. 5). Referring to FIG. 4B, linear drive motor 130 rotates lead screw 132 so that cassette support plate 110 retracts through loading port 106. Then, referring to FIG. 4C, rotary drive motor 124 rotates support member 100 through a ninety degree arc so that cassette support plate 110 now faces holding tub 76 (see FIG. 8A) and window 142 closes loading port 106. The cassette may then be lifted by robot arm 72 and deposited in holding tub 76. Window 142 prevents dust or other contaminants from entering the CMP station.

Referring to FIG. 6, robot arm 72 includes a laterally movable link 152 which descends from a horizontal overhead track 154. The robot arm includes a blade 156 to move substrates 10 and a claw 158 to move cassette 80. Blade 156 and claw 158 are pivotally attached to link 152 by a wrist assembly 150. The link 152 is rotatable about its vertical axis, and is extendable and retractable along that vertical axis. In addition, wrist assembly 150 is rotatable about a horizontal axis. Link 152 can move along overhead track 154 so as to move cassettes between cassette loader 74 and holding tub 76 and to move individual substrates 10 from various positions within the holding tub to transfer station 27.

Blade 156 include a generally rectangular vacuum recess (not shown). The vacuum recess may be connected through vacuum passages and vacuum hoses in blade 156, link 152 and overhead track 154 to a vacuum source. This vacuum may be applied to the recess to vacuum chuck substrate 10 to blade 156. The vacuum chucking is used both to remove individual vertically oriented substrates from cassette 80 and to hold individual substrates horizontally on a lower side of the blade. The blade 156 vacuum chucks the backside of the substrate to avoid mechanical damage to the process side of the substrate. An air pressure sensor may be connected to the vacuum hose to sense whether the vacuum recess has chucked the substrate.

Claw 158 includes two parallel fingers 160 (see FIG. 1) and two fingertips 162 extending perpendicular to the claw. The back of claw 158 also includes a knuckle ridge 164.

Wrist assembly 150 includes a worm wheel 166 fixed to claw 158 and blade 156. Worm wheel 166 is rotatably held on a bearing assembly 168 which is secured to a wrist housing 170. A worm gear 172 descends vertically from link 152 and engages worm wheel 166. Thus, when worm gear 172 turns, blade 156 and claw 158 rotate in a vertical plane about wrist assembly 150.

The overhead track 154 is covered by a protective cover 174. A belt motor 176 (see FIG. 1) protrudes from one end of the overhead track. A carriage 182, rotatably supporting link 152, is slidably connected to a slider 184 and may be moved along overhead track by belt motor 176. A rotary motor 178 connected to carriage 182 rotates link 152 in the horizontal plane. The extension and retraction of link 152 is controlled by a worm motor 186. Worm motor 186 is mounted within carriage 182 and its output shaft is connected to a worm gear 188. Worm gear 188 engages a traveling worm nut 190 which is connected to a support column 192. A wrist motor 194 is mounted at the top of support column 192 to rotate an output shaft 196 which is connected to worm gear 172. Thus, wrist motor 194 rotates the blade and claw in the vertical plane, rotary motor 178 rotates them in the horizontal plane, worm motor 186 translates them vertically, and belt motor 176 translates them horizontally, for a total of four degrees of motion.

As previously discussed, loading apparatus 70 is used to transfer cassette 80 between cassette loader 74 and holding tub 76. The claw 158 attached at the bottom of link 152 is designed for effecting this movement.

As illustrated in FIGS. 7A, 7B and 7C, claw 158 is rotated from the lower end of link 152 to be vertically and downwardly descending. It is then positioned along the side of cassette 80 which has handle 84. As shown in FIG. 7A, the claw is positioned such that its knuckle ridge 164 passes inside of a back surface 92 of handle 84. Then, as shown in FIG. 7B, the claw is horizontally moved away from the cassette such that its knuckle ridge is below the back of the handle. Then, as shown in FIG. 7C, the link vertically raises the claw so that knuckle ridge 164 engages the bottom of back surface 92 of handle 84. Further raising of the claw lifts the side of cassette 80 such that the cassette tilts and a lower side engages fingertips 162 of claw 158. The rotation of the cassette is limited to an amount sufficient that the knuckle ridge and finger tips firmly latch the cassette. In this configuration, claw 158 supports the cassette and its substrates and can move them to any position longitudinal of the overhead track.

Unloading of the cassette from the claw is accomplished by the link lowering the cassette against a lower bearing surface such that cassette untilts and disengages its back of its handle from the ridge knuckle at the back of the claw. A lesser inward movement of the claw clears it of the back of the handle such that the claw can be drawn vertically upwardly from the cassette, leaving the cassette either at the holding station or within the holding tub.

An example of the movement of cassette 80 from cassette loader 74 to holding tub 76 will now be described. As shown in FIG. 8A, wrist assembly 150 is rotated so as to place claw 158 in downwardly facing orientation with blade 156 positioned horizontally above and generally out of the way for the cassette movement. The link is linearly positioned along overhead track 154 such that claw 158 is positioned to pass through handle 84.

Link 152 vertically displaces claw 158 upwardly at the necessary offset angle to engage the handle of cassette 80 and lift the cassette off cassette support plate 110. The link 152 then moves along overhead track 154 to position the cassette over holding tub 76. Finally, the link and attached claw then lower the cassette into holding tub 76, as illustrated in FIG. 8B. The process for moving the cassettes from the holding tub to the cassette loader is the inverse of the lifting step at the holding tub.

FIGS. 9A, 9B, 9C, 9D and 9E are general perspective views showing the sequence of a loading operation in which blade 156 picks a substrate from one of several cassettes 80 positioned within holding tub 76 (not illustrated in these drawings for sake of clarity) and deposits it in transfer station 27. The unloading operation of transferring a wafer from the wafer station back to the cassette operates in reverse from the illustrated sequence.

Referring to FIG. 9A, the loading operation begins by moving link 152 linearly along overhead track 154 so that the blade is positioned over the selected wafer in the selected cassette. As mentioned previously, the cassettes are submerged in the holding tub. The cassettes within the holding tub are supported on inclines at about 3° from vertical.

Referring to FIG. 9B, The link is then lowered into the holding tub along a direction slightly offset from the vertical so that the substrate is roughly aligned on the blade. The inclined path requires a coordinated motion in two dimensions. Vacuum is applied to the vacuum recess of the blade while it is still separated from the substrate. The link then slowly moves the blade toward the selected substrate. When the vacuum sensor senses a vacuum, the substrate has been vacuum chucked and the linear motion of the link stops.

Referring to FIG. 9C, after completion of vacuum chucking, the link draws the blade vertically upwards at the 3° offset. Once the substrate has cleared the cassette and the holding tub, the wrist assembly rotates the blade about a horizontal axis to a position shown in FIG. 9D in which the blade vacuum holds the substrate on its lower side with the process side of the substrate facing downwardly.

Referring to FIG. 9E, when the blade and attached substrate have been horizontally, the link rotates about a vertical axis to place the substrate directly over transfer station 27. Finally, the substrate is dechucked from the blade by releasing the vacuum to the vacuum recess.

The present invention has been described in terms of an embodiment. The invention, however, is not limited to the embodiment depicted and described. Rather, the scope of the invention is defined by the appended claims.

What is claimed is:

1. An apparatus for transporting a substrate-holding cassette to a chemical mechanical polisher, comprising:

an enclosure having a loading port;

a support member pivotable about a vertical axis and positioned inside the enclosure;

a cassette support slidably connected to the support member and movable along a horizontal axis;

a first motor to linearly position the cassette support along the horizontal axis;

a shield connected to the support member at a position offset from the horizontal axis; and a second motor to rotate the support member between a first position in which the shield is aligned with the loading port and a second position in which the horizontal axis is aligned with the loading port so that the cassette support may be driven by the first motor to extend through the loading port.

2. The apparatus of claim 1 wherein the shield comprises a transparent window.

3. The apparatus of claim 1 wherein the cassette support is coupled to the first motor by a lead screw, and the first motor rotates the lead screw to move the cassette support along the horizontal axis.

4. The apparatus of claim 1 wherein the support member includes a linear rail and the cassette support is slidably connected to the support member by a hand which engages the rail.

5. The apparatus of claim 1 further comprising:

a holding tank;

a robotic arm for moving the cassette between the holding tank and the cassette support when the support member is in the first position.

6. The apparatus of claim 4 wherein the robotic arm includes a rotatable claw.

7. A chemical mechanical polishing station, comprising:

an enclosure having a loading port;

a support member pivotable about a vertical axis and positioned inside the enclosure;

a cassette support slidably connected to the support member and movable along a horizontal axis;

a first motor to linearly position the cassette support along the horizontal axis;

a shield connected to the support member at a position offset from the horizontal axis; and a second motor to rotate the support member between a first position in which the shield is aligned with the loading port and a second position in which the horizontal axis is aligned with the loading port so that the cassette support may be driven by the first motor to extend through the loading port;

a holding tank;

a polishing apparatus including a rotatable polishing pad and a carrier head to hold a substrate in contact with the polishing pad; and a robotic arm for moving the cassette between the holding tank and the cassette support when the support member is in the first position, and for moving the substrate between a cassette in the holding tank and the polishing apparatus.

8. A method of transporting a substrate-holding cassette to a chemical mechanical polisher, comprising:

pivoting a support member about a vertical axis to a first position;

extending a cassette support which is slidably connected to the support member through a loading port in an enclosure;

placing a cassette on the cassette support;

withdrawing the cassette support through the loading port; and pivoting the support member to a second position in which a shield that is connected to the support member is aligned with the loading port.

9. The apparatus of claim 4 wherein the linear rail is aligned with the horizontal axis.

10. An apparatus for transporting a substrate-holding cassette to a chemical mechanical polisher, comprising:

an enclosure having a loading port;

a support member pivotable about a first axis between a first position and a second position, the support member positioned inside the enclosure;

a cassette support slidably connected to the support member and movable along a second axis so that if the support member is in the second position, the first axis is aligned with the loading port such that the cassette support may extend through the loading port; and a shield connected to the support member at a position offset from the second axis so that if the support member is in the first position, the shield is aligned with the loading port.

\* \* \* \* \*